United States Patent [19]

Toyama et al.

[11] Patent Number: 5,703,515
[45] Date of Patent: Dec. 30, 1997

[54] TIMING GENERATOR FOR TESTING IC

[75] Inventors: Akira Toyama; Kazuhiro Shimizu, both of Tokyo, Japan

[73] Assignee: Yokogawa Electric Corporation, Tokyo, Japan

[21] Appl. No.: 620,776

[22] Filed: Mar. 22, 1996

[30] Foreign Application Priority Data

Apr. 20, 1995 [JP] Japan .................... 7-094847

[51] Int. Cl.⁶ .................................. H03K 5/04
[52] U.S. Cl. .................. 327/294; 327/172; 327/298; 327/291
[58] Field of Search .................. 327/172–174, 327/270, 276, 291, 294, 298, 299; 371/24, 27

[56] References Cited

U.S. PATENT DOCUMENTS

| | | | |
|---|---|---|---|
| 4,564,953 | 1/1986 | Werking | 327/291 |
| 5,208,598 | 5/1993 | Lueker et al. | 327/291 |
| 5,406,132 | 4/1995 | Housako | 327/172 |
| 5,430,737 | 7/1995 | Yamashita et al. | 371/27 |
| 5,465,066 | 11/1995 | Yamashita et al. | 327/270 |
| 5,590,137 | 12/1996 | Yamashita et al. | 327/27 |

FOREIGN PATENT DOCUMENTS 2-100512  4/1990  Japan .................... 327/165

Primary Examiner—Timothy P. Callahan
Assistant Examiner—T. T. Lam
Attorney, Agent, or Firm—Moonray Kojima

[57] ABSTRACT

A timing generator which receives a rate signal and generates an output signal based on the rate signal, and comprises at least two delay lines for causing delays in the rate signal, a formatter for receiving signals from the delay lines and for determining the rise and fall of an output signal according to such signals from the delay lines, and for generating an output signal, memories for storing delay time data from the delay lines, and a data selector for taking the delay time data from the memories and to switch the delay time data, whereby accurate timing signals are generated utilizing short skew adjustment time.

19 Claims, 6 Drawing Sheets

TIMING GENERATOR FOR TESTING IC

BACKGROUND OF THE INVENTION

1. Field of Invention

This invention relates to a timing generator, such as those used, for example in Integrated Circuit Testers, and which can produce a signal with a short skew adjustment time and good timing accuracy.

2. Description of the Related Art

The timing generator used for IC (otherwise known as integrated circuit) testers generally produces an output from an SR flip flop circuit to whose set or reset terminal a signal obtained by delaying a rate signal is inputted. The output signal from the timing generator is applied to an IC being tested via a driver. Such devices have been disclosed, for example in Japan Patent Application 88/144,269 and Japan UM Application 92/115,082.

These devices, however, require inverting of the delay time of the rate signal to the set or reset terminal of the flip flop circuit, following a pattern data change, that is from "1" to "0", for example. This requires a change in delay time data and thus causes a complicated changing operation which requires a substantial amount of time.

FIG. 1 shows a device which is capable of changing the delay time data easily, wherein delay lines 20 and 21 receive a rate signal "a" from an external device (not shown) and output edge signals "b" and "c", respectively, by delaying the rate signal "a". Delay lines 22 and 23 receive edge signal "b" from delay line 20, and delayed edge signal "b". Delay lines 24 and 25 receive edge signal "c" from delay line 21 and delay edge signal "c". Delay lines 22 to 25 are used for adjusting skews between signal paths. Edge selector 26 changes edge signals from delay lines 22 to 25, based on the format data and the pattern data from an external device. Formatter 27 comprises at least one SR flip flop circuit, to whose set or reset terminal, the edge signal from edge selector 26, is inputted. The device outputs the output from this SR flip flop circuit as an output signal "d". Formatter 27 selects whether or not the edge signal is inputted to the SR flip flop circuit. Memories 28 and 29 store the delay time data of delay lines 20 and 21, that is, the edge signal timing data, and addresses are instructed from the external device.

The operation of the device of FIG. 1 is described below in connection with the timing chart of FIG. 2. The output signal "d1" is an output signal "d" when the pattern is "1", and the output signal "d0" is the output signal "d" when the patter data is "0", where data stored in memories 28 and 29 are delayed by delay lines 20 and 21 by times "T1" and "T2", respectively, and the format data is that is for "return to zero".

Memories 28 and 29 apply delay time data to delay lines 20, and 21, respectively, upon receiving address instructions from an external device (called "address"). Delay line 20 delays rate signal "a" by a delay time "T1" based on data from memory 28 and outputs edge signal "b". Delay line 21 delays rate signal "a" by a delay time "T2" based on data from m emory 29 and outputs edge signal "c".

If the pattern data is "1" and the format data is "RZ", edge selector 26 outputs edge signal "b" to the set terminal of the sW flip flop circuit in formatter 27, and outputs edge signal "c" to the reset terminal of the SR flip flop circuit. Consequently, formatter 27 outputs output signal "d1" from the SR flip flop circuit of formatter 27.

On the other hand, if the pattern data is "0" and the format data is "RZ", edge selector 26 outputs edge signal "b" to the reset terminal of the SR flip flop circuit. Consequently, formatter 27 outputs output signal "d0" from the SR flip flop circuit of formatter 27. However, the formatter 27 operates so that no edge signal is inputted to the set terminal of the SR flip flop circuit because the pattern data is "0" and the format data is "RZ".

In a timing generator, the times at the rise and fall of the signals outputted from the SR flip flop circuit shift between when the edge signal is inputted to either the set or reset terminal of the SR flip flop circuit of formatter 27. For this reason, the device requires many signal paths, and skews must be adjusted between paths using many delay lines, such as delay lines 22 to 25. In addition, there is the problem in which insertion of edge selector 26 leads to deterioration of the timing accuracy. This deterioration causes timing shift in signals inputted to an IC when utilizing an IC tester, and thus, the output signal from the IC also shifts. Consequently, an IC that should be judged acceptable may be judged to be faulty or may be rejected. On the other hand, an IC that should be judged faulty might be judged acceptable. Furthermore, since an IC tester, for example, has 256 timing generators, a long time is required for calibration even for an increase of one delay line, as well as for adjusting the skew of one timing generator.

Thus, in the art, there is still room for improvement of existing timing generators.

SUMMARY OF THE INVENTION

Accordingly, an object of the invention is to overcome the aforementioned and other deficiencies, and disadvantages of the prior art.

Another object is to provide a timing generator which has a short skew adjustment time and can output good accurate timing signals.

DETAILED DESCRIPTION OF THE PREFERRED EMBODIMENTS

Figure 1:
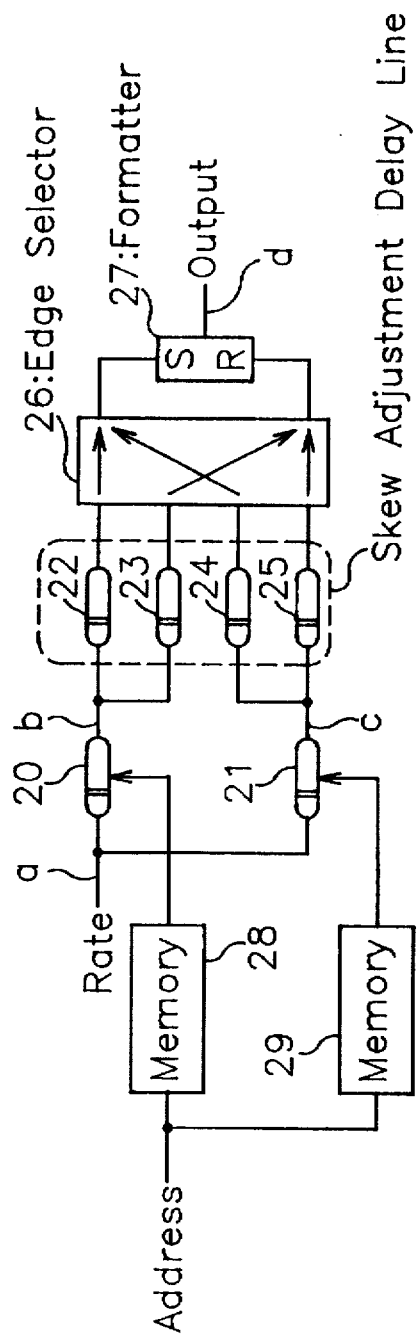
FIG. 1 is a diagram depicting a conventional timing generator.
Figure 2:
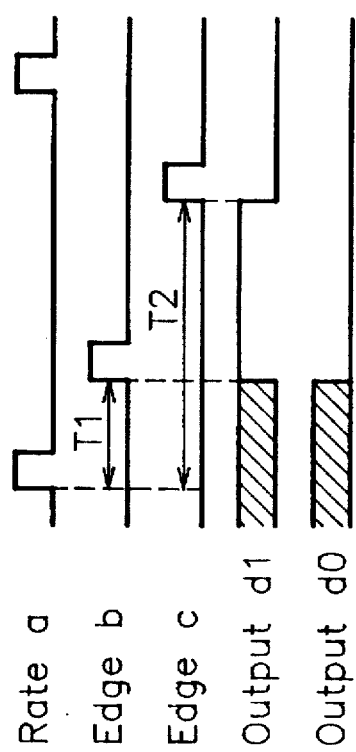
FIG. 2 is a timing chart depicting operation of the device of FIG. 1.
Figure 3:
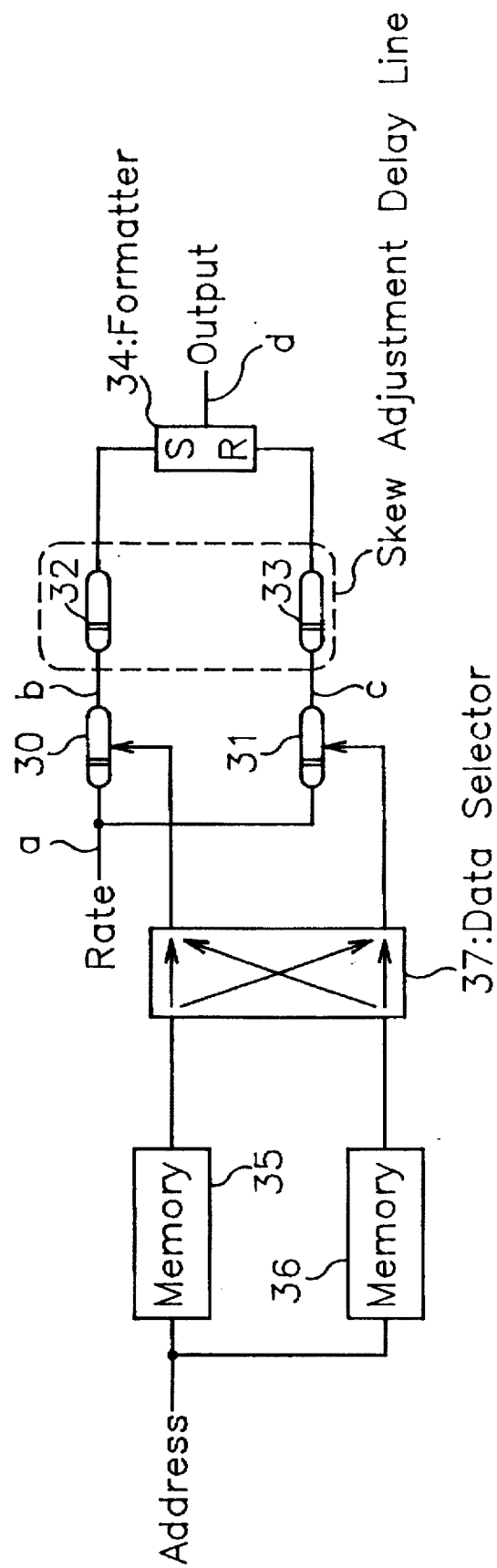
FIG. 3 is a diagram depicting an illustrative embodiment of the invention.

Referring to FIG. 3, delay lines 30 and 31 receive an input rate signal "a" from an external device (not shown), and delay rate signal "a" and output edge signals "b" and "c", respectively. Delay lines 32 and 33 receive edge signals "b" and "c" from each delay line 30 and 31, and delay these edge signals, respectively. Delay lines 32 and 33 are used for adjusting skews between the paths. Formatter 34 receives input signals from delay lines 32 and 33, and determines the rise and fall of an output signal by using the input signals, and produces output signal "d". Formatter 34 comprises at least one SR flip flop circuit. A signal from delay line 32 is inputted to the set terminal of the SR flip flop circuit and a signal from delay line 33 is inputted to the reset terminal of the SR flip flop circuit. Then, the SR flip flop circuit produces output signal "d". Formatter 34 also selects whether or not the edge signal is inputted to the SR flip flop circuit by using the pattern data and the format data from the external device. Memories 35 and 36 store delay time data used for instructing delay lines 30 and 31, that is, the edge signal timing data, and addresses are instructed by the external device. Data selector 37 is located outside the main signal paths and applies delay time data which controls the timing delay of delay lines 30 and 31 by switching the delay time data from memories 35 and 36.

Figure 4:
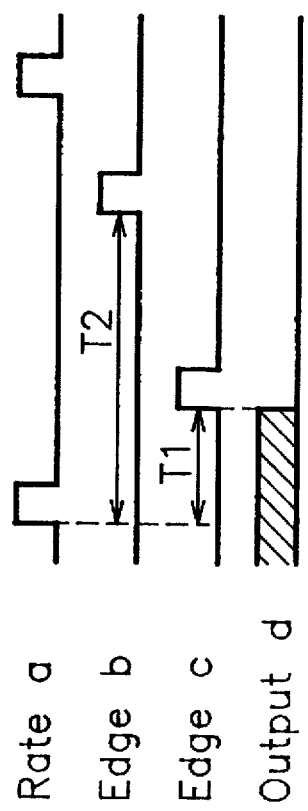
FIGS. 4(A) and 4(B) are timing charts showing operation of the embodiment of FIG. 3.
Figure 4:
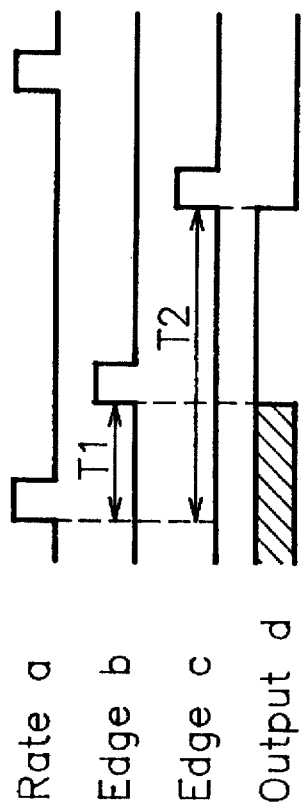

The operation of the FIG. 3 embodiment will now be explained with reference to FIGS. 4(A) and 4(B), wherein FIG. 4(A) is a timing chart for pattern data "1", and FIG. 4(B) is a timing chart for pattern data "0", and times "T1" and "T2" are the delay times controlled by delay time data stored in memories 35 and 36, respectively, and the format data is "RZ". Memories 35 and 36 produce the delay time data upon receiving instruction addresses from the external device.

When the pattern data is "1" and the format data is "RZ", data selector 37 supplies delay time data "T1" from memory 35 to delay line 30, and delay time "T2" from memory 36 to delay line 31. Delay line 30 delays rate signal "a" by a delay time "T1" and supplies edge signal "b" to the set terminal of the SR flip flop circuit in formatter 34. Delay line 31 delays rate signal "a" by delay time "T2" and supplies edge signal "c" to the reset terminal of the SR flip flop circuit of formatter 34. Consequently, formatter outputs output signal "d" from the SR flip flop circuit.

When the pattern data is "0" and the format data is "RZ", data selector 37 supplies delay time "T2" from memory 36 to delay line 30, and delay time "T1" from memory 35 to delay line 31. Delay line 30 delays rate signal "a" by delay time "T2" and outputs edge signal "b" to the set terminal of the SR flip flop circuit of formatter 34. Delay line 31 delays rate signal "a" by delay time "T1" and produces edge signal "c" to the reset terminal of SR flip flop circuit of formatter 34. Consequently, formatter 34 outputs output signal "d" from SR flip flop circuit in formatter 34. However, since formatter 34 is subjected to pattern data "0" and format data "RZ", it operates so that the edge signal is not inputted to the set terminal of the SR flip flop circuit.

In addition, the adjustment of delay time in delay lines 32 and 33 is adjusted before output signal "d" is produced. For example, in an IC tester, delay lines 32 and 33 are also used for adjustment of skews between timing generators to adjust the skews before the testing of objects.

An actual device is configured as described below because a "surrounded by complement" (called "SBC") waveform is generated.

Figure 5:
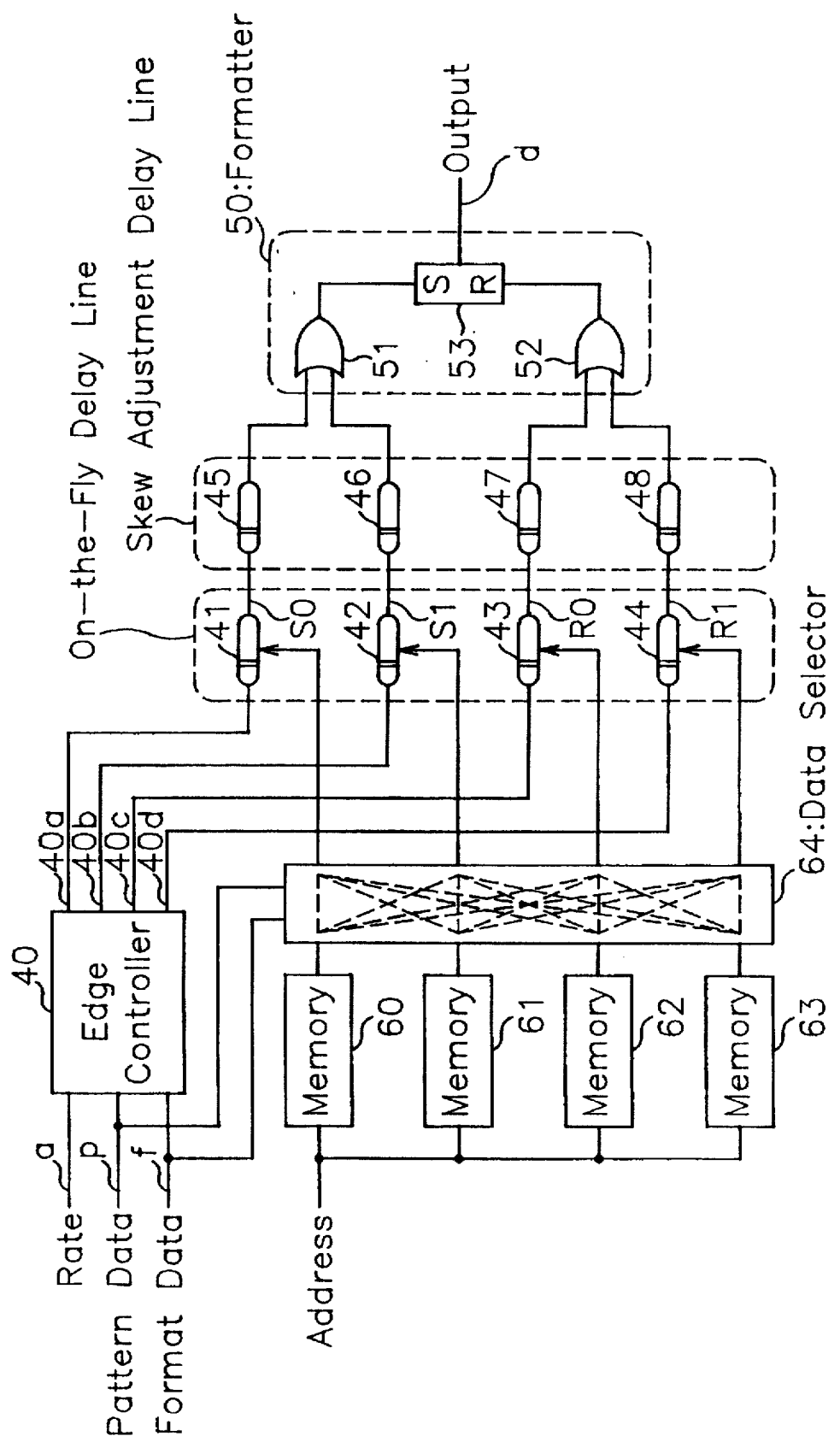
FIG. 5 is a diagram depicting details of another illustrative embodiment of the invention.

FIG. 5 shows edge controller 40 which outputs enable signals 40a and 40d in accordance with rate signal "a", pattern data "p" and format data "f" from an external device (not shown). For example, when format data "f" is "RZ" and pattern data "p" is "1", edge controller 40 produces enable signals 40a and 40c at the first rise of rate signal "a" and produces enable signals 40b and 40d at the second rise of rate signal "a". Controller 40 again produces enable signals 40a and 40c at the third rise of rate signal "a". The above operation is repeated. When format data "f" is "RZ" and the pattern data "p" is "0", enable signals 40a and 40b are not produced. In addition, if format data "f" is "SBC", and pattern data "p" is "0", controller 40 produces enable signals 40a, 40b, and 40c at the rise of rate signal "a". If format data "f" is "SBC" and pattern data "p" is "1", controller 40 produces enable signals 40b, 40c and 40d at the rise of rate signal "a".

On-the-fly delay lines 41 to 44 receive enable signals 40a to 40d, respectively, delay these signals and produce edge signals S0, S1, R0, and R1, respectively. Delay lines 45 to 48 receive the edge signals S0, S1, R0 and R1, respectively, and delay these signals. Delay lines 45 to 48 are utilized for adjusting the skews between the paths.

Formatter 50 receives the input edge signals from the delay lines 45 to 48, and determines the rise and fall of the output signal "d" by using the edge signals and generates the output signal "d". Formatter 50 comprises OR gates 51 and 52, and an SR flip flop circuit 53. OR gate 51 receives signals from delay lines 45 and 46 and produces an output signal which is applied to the set terminal of the SR flip flop circuit 53. OR gate 52 receives signals from delay lines 47 and 48 and produces an output signal which is applied to the reset terminal of SR flip flop circuit 53.

Memories 60 to 63 store delay time data for the respective delay lines 41 to 44, that is, the timing data of the edge signals, and receive addresses instructed by an external device. Data selector 64 is located outside the main signal paths and switches the delay time data from memories 60 to 63 according to pattern data "p" and format data "f" from an external device and supplies such delay time data to delay lines 41 to 44. For example, when format data "f" is "RZ" and pattern data "p" is "1", the delay time data in memory 60 is provided to delay line 41, and the delay time data in memory 61 is provided to delay line 42. Similarly, the delay time data in memory 62 is provided to delay line 43 and the delay time data in memory 63 is provided to delay line 44. When format data "f" is "RZ" and pattern data "p" is "0", the delay time data in memory 60 is provided to delay line 43 and the delay time data in memory 61 is provided to delay line 44, while the delay time data in memory 62 is provided to delay line 41 and the delay time data in memory 63 is provided to delay line 42.

Figure 6:
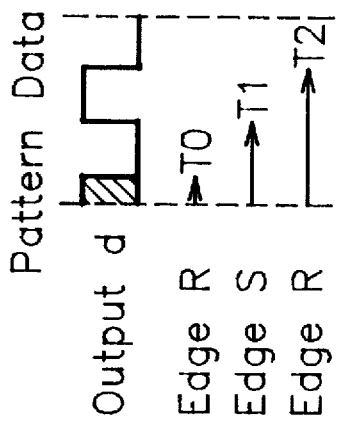
FIGS. 6(A) and 6(B) are diagrams explaining SBC waveform generation.
Figure 6:
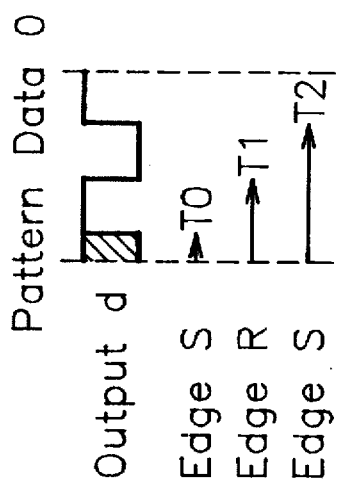

The operation of the embodiment of FIG. 5 will now be described with reference to FIGS. 6(A) and 6(B). First the generation of SBC waveforms will be explained. FIG. 6(A) shows the waveform of output "d" when pattern data "p" is "0" and FIG. 6(B) shows the waveform of output "d" when the pattern data "p" is "1", where the broken lines show the instants of the rise of rate signal "a".

In FIG. 6(A), an edge signal is applied to the set terminal of SR flip flop circuit 53 at the delay time "T0" from a rise of rate signal "a". Then, another edge signal is applied to the reset terminal of SR flip flop circuit 53 at the delay time "T1" from the same rise of rate signal "a". Furthermore, the third edge signal is applied to the set terminal of SR flip flop circuit 53 at the delay time "T2" from the same rise of rate signal "a" At this instant, output signal "d" is outputted from SR flip flop circuit 53.

In FIG. 6(B), an edge signal is applied to the reset terminal of SR flip flop circuit 53 at the delay time "T0" from the rise of rate signal "a". Then, another edge signal is applied to the set terminal of SR flip flop circuit 53 at the delay time of "T1" from the same rise of rate signal "a" Moreover, the third edge signal is applied to the reset terminal of SR flip flop circuit 53 at the delay time "T2"

from the same rise of rate signal "a". At that instant, output signal "d" is outputted from SR flip flop circuit 53.

Figure 7:
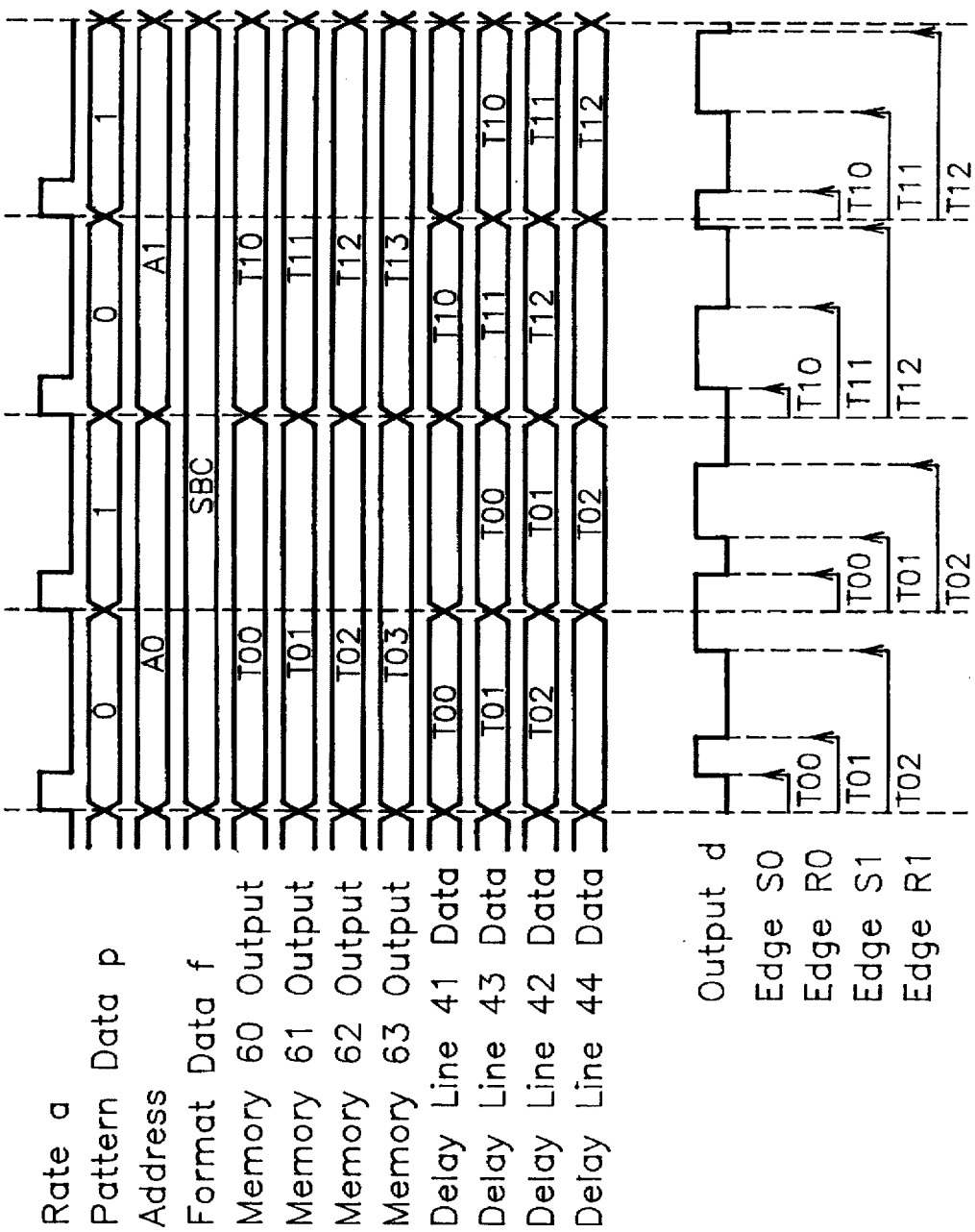
FIG. 7 is a timing charge depicting operation of the embodiment of FIG. 5.

Next, operation of the embodiment for SRC waveform generation will be described with reference to FIG. 7, wherein the delayed time data at address "A0" of memories 60 to 63 are "T00", "T01", "T02", and "T03" respectively, while the delay time data at address "A1" of the memories are "T10", "T11", T"12" and "T13", respectively.

Edge controller 40 produces enable signals 40a to 40c according to rate signal "a", pattern data "p" of "0", and format data "f" of "SBC" When address "A0" is provided to memories 60 to 63, there are produced delay time data "T00", "T01", "T02", and "T03", respectively. Data selector 64 provides the delay time data in memory 60 to delay line 41, the delay time data in memory 61 to delay line 43, and the delay time data in memory 62 to delay line according to pattern data "p" of "0" and format data "f" of "SBC".

Delay line 41 produces edge signal "S0" after delaying enable signal 40a by delay time "T00" of the delay time data. Delay line 42 outputs edge signal "S1" after delaying enable signal 40b by delay time "T02" of the delay time data. Delay line 43 produces edge signal "R0" after delaying enable signal 40c by delay time "T01" of the delay time data.

Edge signal "S0" is applied to the set terminal of SR flip flop circuit 53 via delay line 45 and OR gate 51. Consequently, output signal "d" of SR flip flop circuit 53 rises, after delay time "T00" of the delay time data, from the rise of rate signal "a". Next, edge signal "R0" is applied to the reset terminal of SR flip flop circuit 53 via delay line 47 and OR gate 52. Consequently, output signal "d" of SR flip flop circuit 53 falls after delay time "T01" of the delay time data, from the same rise of rate signal "a". Then, edge signal "S1" is applied to the set terminal of SR flip flop circuit 53 via delay line 46 and OR gate 51. Consequently, output signal "d" of SR flip flop circuit 53 riss after delay time "T02" of the delay time data from the smae rise of rate signal "a".

When only pattern data "p" changes to "1" and rate signal "a" rises, edge controller 40 produces enable signals 40b to 40d. Data selector 64 provides the delay time data in memory 60 to delay line 43, the delay time data in memory 61 to delay line 42, and the delay time data in memory 62 to delay line 44.

Delay line 42 produces edge signal "S1" after delaying enable signal 40b by delay time "T01" of delay time data. Delay line 43 produces edge signal "R0" after delaying enable signal 40c by delay time "T00" of delay time data. Delay line 44 produces edge signal "R1" after delaying enable signal 40d by delay time "T02" of the delay time data.

Edge signal "R0" is applied to the reset terminal of SR flip flop circuit 53 via delay line 47 and OR gate 52. Consequently, output signal "d" of SR flip flop circuit 53 falls after delay time of "T00" of the delay time data, from the rise of rate signal "a". Next, edge signal "S1" is applied to the set terminal of SR flip flop circuit 53 via delay line 46 and OR gate 51. Consequently, output signal "d" of the SR flip flop circuit 53 rises after delay time of "T01" of the delay time data, from the same rise of rate signal "a". Edge signal "R1" is applied to the reset terminal of SR flip flop circuit 53 via delay line 48 and OR gate 52. Consequently, output signal "d" of SR flip flop circuit 53 falls, after delay time of "T02" of the delay time data,from the same rise of rate signal "a".

When pattern data "p" changes to "0", the addresses of memories 60 to 63 change from "A1", and rate signal "a" rises, and the delay time data obtained from memories 60 to 63 are caused to vary. The delay time data changes vary the rise times of the edge signals "S0", "R0", and "S1". Adjustment of the delay time of delay lines 45 to 48 is carried out before producing output signal "d", similar to the embodiment of FIG.3.

Since the delay time data outputted from memories 60 to 63 are provided to delay lines 41 to 44 by switching data selector 64, it is not necessary for a data selector to be provided in the signal path, and signals with good accuracy of timing can be produced. In addition, since signal paths need not be increased, the skew adjustment time is made shorter.

Figure 8:
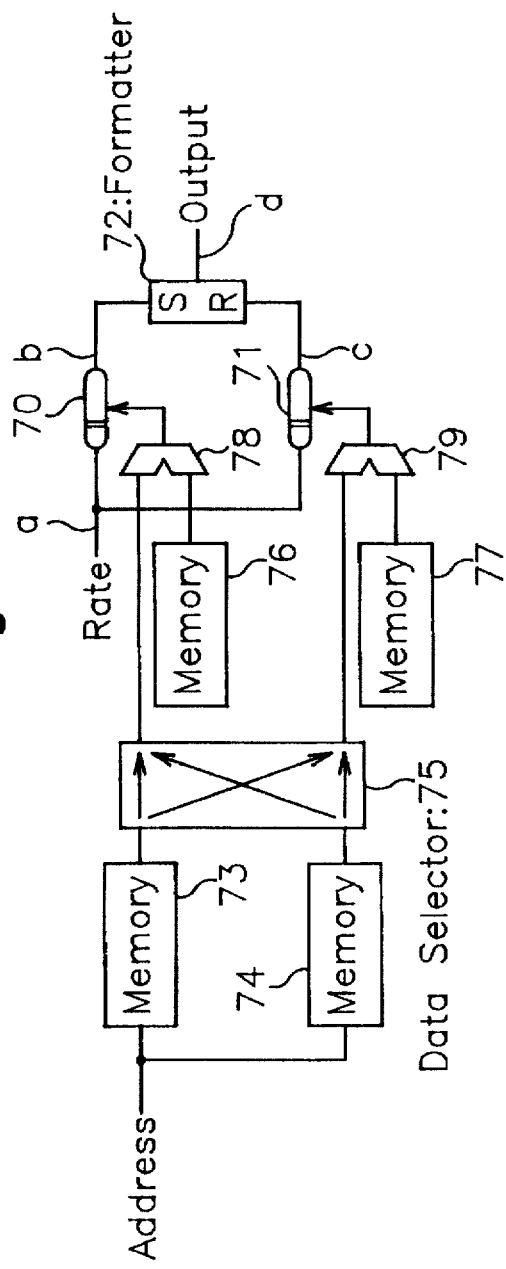
FIG. 8 is a diagram depicting a further illustrative embodiment of the invention.

In FIG. 8, delay lines 70 and 71 receive a rate signal "a" from an external device (not shown), delay rate signal "a", and output edge signals "b" and "c", respectively. Formatter 72 receives signals from delay lines 70 and 71, and determines the rise and fall of the output signals by using such input signals, and produces output signal "d". Formatter 72 comprises at least one SR flip flop circuit, to whose set terminal edge signal "b" from delay line 70 is applied and to whose reset terminal edge signal "c" from delay line 71 is applied. The SR flip flop circuit produces the output signal "d" Formatter 72 also selects whether a signal is applied to the SR flip flop circuit, or not, in accordance with the pattern data and the format data, supplied by an external device. Memories 73 and 74 store the delay time data from delay lines 70 and 71, that is, the timing data of edge signals upon instructions of addresses from the external device. Data selector 75 provides the delayed time data from memories 73 and 74 by switching the delay time data. Memories 76 and 77 store the delay time data for adjustment skews between paths. Adders 78 and 79, each add the delayed time data from data selector 75 and the delay time data from memories 76 and 77, respectively, and provide the results to each of delay liens 70 and 71, respectively.

The embodiment stores the delay time data for skew adjustment in memories 76 and 77 instead of providing delay lines 32 and 33 of FIG. 3. The embodiment adds the delay time data in memories 76 and 77 to the delay time data from data selector 75 by using adders 78 and 79 and provides the results to delay lines 70 and 71, respectively. Other operations are similar to the embodiment of FIG. 3. The arrangement of FIG. 8 can reduce the number of delay lines for skew adjustment.

Figure 9:
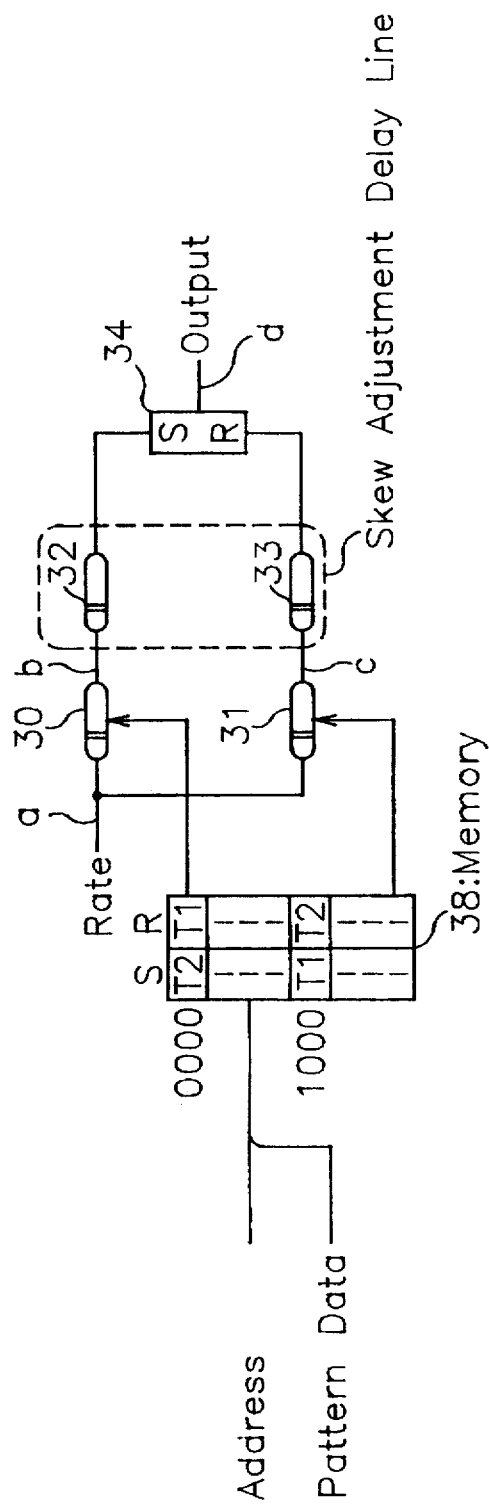
FIG. 9 is a diagram depicting a still further embodiment of the invention.

In FIG. 9, the same components of FIG. 3 are provided with the same numerals. Also, in FIG. 9, memory 38 stores the delay time data for delay lines 30 and 31, that is, the timing data of the edge signals, and is instructed with addresses in accordance with pattern data and format data, from an external device. Memory 38 is divided into two regions. These two regions comprise a delay time data region to be provided to delay lines 30 and 31 when the pattern data is "0" and another delay time data region to be provided to delay lines 30 and 31 when the pattern data is "1". These two regions are divided by using a pattern data in the most significant bit of memory 38 address. For example, when the pattern data is "1" and the address data is "000", the address instructed for memory 38 is "1000". On the other hand, when the pattern data is "0", and the address data is "000", the address instructed for memory 38 is "0000".

The operation of the embodiment is as follows; Let the delay time data at address "1000" of memory 38 be "T1" and "T2" and provided to delay lines 30 and 31 respectively. Also, let the delay time data at address "0000" of memory 38 be "T2" and "t1" and provided to delay lines 30 and 31, respectively. Assume that the format data is "RZ".

The FIG. 9 embodiment operates in almost the same manner as that of the embodiment of FIG.3. Thus, the operation of the FIG. 9 embodiment will be described with reference to the timing charts of FIGS. 4(A) and 4(B). In FIG. 4(A).memory 38 receives pattern data "1" and address data "000" applied from an external device. Memory 38 produces the delay time data at its address "1000". As a result, delay time data "T1" is provided to delay line 30 and delay time data "T2" is provided to delay line 31. Other operations are the same as those for the embodiment of FIG. 3.

In FIG. 4(B), memory 38 receives pattern data "0" and address data "000" applied from an external device. Memory 38 produces the delay time data at its address "0000". As a result, delay time data "T2" is provided to delay line 30 and delay time data "T1" is provided to delay line 31. Other Operations are the same as for the embodiment of FIG. 3.

The delay time data can be provided to delay lines 30 and 13 by switching the delay time data produced by memory 38 in accordance with the pattern data and the address data. This enables good timing accuracy without the requirement of a data selected located in the signal paths. In addition, the embodiment requires less skew adjustment time. Also, advantageously, the calibration time can be shortened because the output signal can be changed easily and simply and the signal paths are not required to be increased.

Although the arrangement in which the data selector switches the signals by using the pattern data and the format data, the invention is not so limited. For example, data selector using new data can be used. Also, an arrangement can apply the rate signal "a" to delay lines 41 to 44 and select an edge signal which is directly then applied to the SR flip flop circuit. Moreover, although two memories are shown in FIGS. 3, 5 and 8, the invention is not so limited. An arrangement can be envisioned where only one memory is used with such memory having different regions for storage of the different time delays.

The foregoing description is illustrative of the principles of the invention. Numerous extensions and modifications thereof would be apparent to the worker skilled in the art. All such extensions and modifications are to be considered to be within the spirit and scope of the invention.

What is claimed is:

1. A timing generator for generating an output signal in accordance with a rate signal, comprising:
   at least two delay lines for delaying said rate signal;
   formatter means for receiving signals from said at least two delay lines, for determining rise and fall of an output signal by using said received signals, and for generating said output signal;
   memory means for storing delay time data for said at least two delay lines; and
   data selector means for supplying said delay time data from said memory means to said at least two delay lines by switching.

2. The generator of claim 1, wherein said formatter means comprises delay lines to adjust skews in an input stage thereof.

3. The generator of claim 2, wherein said data selector means comprises means for combining a first delay time data with a second delay time data used for adjusting skews, and means for supplying the combined delay time data to said at least two delay lines.

4. The generator of claim 1, further comprising an edge controller means for outputting rate signals to said at least two delay lines in accordance with pattern data and format data, respectively.

5. The generator of claim 1, wherein said formatter means comprises means for generating said output signal in accordance with a pattern data and a format data.

6. The generator of claim 1, wherein said formatter means comprises at least one SR flip flop circuit.

7. A timing generator for generating an output signal in accordance with a rate signal, comprising:
   at least two delay lines for delaying said rate signal;
   formatter means for receiving signals from said at least two delay lines, for determining rise and fall of an output signal using said received signals, and for generating said output signal; and
   memory means for storing delay time data for use in said at least two delay lines, wherein said delay time data is applied from said memory means to said at least two delay lines through a switching function under instructions from changed address instructions.

8. The generator of claim 7, wherein said address instructions are carried out by an address data and a pattern data.

9. The generator of claim 7, wherein said formatter means comprises delay lines to adjust skews in an input stage thereof.

10. The generator of claim 9, wherein said memory means comprises means for combining a first delay time data with a second delay time data used for adjusting skews, and means for supplying the combined delay time data to said at least two delay lines.

11. The generator of claim 7, further comprising an edge controller means for outputting rate signals to said at least two delay lines in accordance with pattern data and format data, respectively.

12. The generator of claim 7, wherein said formatter means comprises means for generating said output signal in accordance with a pattern data and a format data.

13. The generator of claim 7, wherein said formatter means comprises at least one SR flip flop circuit.

14. A timing generator for generating an output signal in accordance with a rate signal, comprising:
   at least two delay lines for delaying said rate signal;
   formatter means for receiving signals from said at least two delay lines, for determining rise and fall of an output signal by using said received signals, and for generating said output signal;
   memory means for storing delay time data of said at least two delay lines, wherein said delay time data from said memory means is supplied to said at least two delay lines by switching; and
   edge controller means for outputting rate signals to said at least two delay lines in accordance with pattern data and format data, respectively.

15. The generator of claim 14, wherein said formatter means comprises delay lines to adjust skews in an input stage thereof.

16. The generator of claim 14, wherein said memory means comprises means for combining a first delay time data with a second delay time data used for adjusting skews, and means for supplying the combined delay time data to said at least two delay lines.

17. The generator of claim 14, wherein said formatter means comprises means for generating said output signal in accordance with said pattern data and said format data.

18. The generator of claim 14, wherein said formatter means comprises at least one SR flip flop circuit.

19. A timing generator for outputting a timing signal in accordance with a rate signal, said generator comprising:

an edge controller means for receiving said rate signal and for outputting enable signals in accordance with pattern data and format data;

four delay lines for receiving said enable signals from said edge controller means as input signals and for delaying said enable signals;

formatter means comprising two OR gates, each of which receives outputs from a set of two of said four delay lines, and an SR flip flop circuit having a set terminal for receiving output from one of said OR gates and a reset terminal for receiving output from the other of said OR gates, and means for supplying an output signal from said SR flip flop circuit; and memory means for storing delay time data for said four delay lines, wherein said delay time data is supplied from said memory means to said four delay lines through switching.

* * * * *